United States Patent
Mori et al.

(10) Patent No.: US 10,062,552 B2
(45) Date of Patent: Aug. 28, 2018

(54) COPPER ALLOY SPUTTERING TARGET AND MANUFACTURING METHOD OF COPPER ALLOY SPUTTERING TARGET

(71) Applicant: MITSUBISHI MATERIALS CORPORATION, Tokyo (JP)

(72) Inventors: Satoru Mori, Okegawa (JP); Toshio Sakamoto, Kitamoto (JP); Kiyoyuki Ookubo, Iwaki (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 840 days.

(21) Appl. No.: 14/333,812

(22) Filed: Jul. 17, 2014

(65) Prior Publication Data

US 2015/0034482 A1 Feb. 5, 2015

(30) Foreign Application Priority Data

Jul. 31, 2013 (JP) .................................. 2013-159962
Jun. 12, 2014 (JP) .................................. 2014-121527

(51) Int. Cl.
| | | |
|---|---|---|
| *H01J 37/34* | (2006.01) | |
| *C23C 14/34* | (2006.01) | |
| *B22D 7/00* | (2006.01) | |
| *B22D 11/108* | (2006.01) | |
| *B22D 11/00* | (2006.01) | |
| *C22C 1/02* | (2006.01) | |
| *C22C 9/00* | (2006.01) | |
| *C22F 1/08* | (2006.01) | |

(52) U.S. Cl.
CPC .......... *H01J 37/3429* (2013.01); *B22D 7/005* (2013.01); *B22D 11/004* (2013.01); *B22D 11/108* (2013.01); *C22C 1/02* (2013.01); *C22C 9/00* (2013.01); *C22F 1/08* (2013.01); *C23C 14/3414* (2013.01); *H01J 37/3491* (2013.01)

(58) Field of Classification Search
CPC .... B22D 11/004; B22D 11/108; B22D 7/005; H01J 37/3429; H01J 37/3491; C22C 1/02; C22C 9/00; C23C 14/3414

USPC ........................................ 204/298.12, 298.13
See application file for complete search history.

(56) References Cited

U.S. PATENT DOCUMENTS 7,767,043 B2 * 8/2010 Segal .................... B21C 23/001
148/528

FOREIGN PATENT DOCUMENTS

| CN | 1447864 A | 10/2003 |
|---|---|---|
| CN | 1681960 A | 10/2005 |
| CN | 1985014 A | 6/2007 |
| JP | 2002-129313 A | 5/2002 |
| JP | 2009-215613 A | 9/2009 |
| JP | 2011-044674 A | 3/2011 |
| JP | 2011-162876 A | 8/2011 |
| JP | 2013-014808 A | 1/2013 |
| JP | 2014-129580 A | 7/2014 |

OTHER PUBLICATIONS

Office Action dated Nov. 3, 2016, issued for the Chinese patent application No. 201410347611.3 and a partial English translation of the Search Report.
Notice of Allowance dated Dec. 12, 2017, issued for the Japanese patent application No. 2014-121527 and English translation thereof.

* cited by examiner

*Primary Examiner* — Rodney G McDonald
(74) *Attorney, Agent, or Firm* — Locke Lord LLP

(57) ABSTRACT

A copper alloy sputtering target is formed by a copper alloy including the content of Ca being 0.3 to 1.7% by mass, the total content of Mg and Al being 5 ppm or less by mass, the content of oxygen being 20 ppm or less by mass, and the remainder is Cu and inevitable impurities. A manufacturing method of a copper alloy sputtering target comprises steps of: preparing a copper having purity of 99.99% or more by mass; melting the copper so as to obtain a molten copper; controlling components so as to obtain a molten metal having a predetermined component composition by the addition of Ca having a purity of 98.5% or more by mass into the molten copper and by melting the Ca; casting the molten metal so as to obtain an ingot; and performing stress relieving annealing after performing hot rolling to the ingot.

1 Claim, No Drawings

COPPER ALLOY SPUTTERING TARGET AND MANUFACTURING METHOD OF COPPER ALLOY SPUTTERING TARGET

TECHNICAL FIELD

The present invention relates to a copper alloy sputtering target used as a target during sputtering for forming a copper alloy film as a wiring film, such as a gate electrode, a source electrode and a drain electrode of a thin film transistor, on a substrate composed of glass, amorphous Si, silica, or the like, by sputtering, and in particular, relates to a sputtering target formed by Cu—Ca based copper alloy (copper alloy containing Ca) and a manufacturing method of copper alloy sputtering target.

Priority is claimed on Japanese Patent Application No. 2013-159962 filed Jul. 31, 2013, and Japanese Patent Application No. 2014-121527 filed Jun. 12, 2014, the contents of which are incorporated herein by reference.

BACKGROUND ART

A flat panel display, such as a liquid crystal display and an organic light emitting display, has a structure which forms a thin film transistor (hereinafter describe as "TFT") and a display circuit on a substrate such as glass. However, according to a recent request of an increase in size and in definition of the thin-screen television, a display panel having a large scale and high-definition has been required equally to a display panel using this type of TFT (TFT panel).

Conventionally, as a wiring film, such as a gate electrode, source electrode and drain electrode of TFT panel having a large scale and high-definition, it was conventional to use a wiring film which is formed of aluminum based materials. However, recently, the use of a wiring film formed of copper (Cu) based materials having a higher electrical conductivity than aluminum (Al) has been promoted for lowering in resistance of a wiring film.

As a copper based materials used for a wiring film of the TFT panel, a variety of copper alloys are proposed, and for example, in Patent Document 1 or Patent Document 2 shown below, Cu—Ca alloy have gotten attention recently. A wiring film formed of Cu—Ca alloy is not only lower in specific resistance than (a wiring film formed of) Al based materials, but also is more excellent in adhesion properties between the wiring film and the substrate such as the glass than a wiring film formed of Al based materials. In addition, in a case where a wiring film of the TFT panel is formed by this type of Cu—Ca alloy, sputtering is applied normally, and in this case, a sputtering target formed of Cu—Ca alloy is used.

In addition, in Patent Document 3 shown below, in a sputtering target formed of Cu—Ca alloy, a target as defined in a range of 10 to 50 μm of an average particle size of Cu—Ca based crystallized product is shown in order to suppress the occurrence of abnormal discharge during sputtering.

PRIOR ART DOCUMENTS

Patent Documents

[Patent Document 1] Japanese Unexamined Patent Application, First Publication No. 2009-215613
[Patent Document 2] Japanese Unexamined Patent Application, First Publication No. 2011-044674
[Patent Document 3] Japanese Unexamined Patent Application, First Publication No. 2013-014808

DISCLOSURE OF THE INVENTION

Problems to be Solved by the Invention

In order to respond to a lowering in the cost of a TFT panel with high definition, there is a strong demand for improving productivity, also in order to further improve productivity, the demand for increasing the deposition rate of film is increasing. In order to increase the deposition rate, it is necessary to increase the power applied to the sputtering. However, in general, the increase of the input power during sputtering leads to an increase in the occurrence of abnormal discharge. In addition, when sputtering is carried out using a target formed of Cu—Ca alloy, there is a problem in that abnormal discharge is easily induced by the increase of the input power.

Here, the abnormal discharge represents a phenomenon in which a large discharge occurs abnormally by an extremely high current flowing rapidly and abruptly as compared to a normal sputtering. When such abnormal discharge occurs, there is a possibility that it may become a cause of generating particles and the thickness of the deposited film may become uneven. Therefore, it is desired that abnormal discharge during sputtering be avoided as much as possible.

The present invention has been made in view of the problems described above, and the purpose of the present invention is to provide a sputtering target using a Cu—Ca-based alloy such as a Cu—Ca alloy, the Cu—Ca-based alloy is obtained by the addition of Ca mainly as an alloying element with respect to Cu, and the sputtering target is capable of suppressing the frequent abnormal discharge occurring easily during sputtering in a higher power in order to improve productivity of the deposition rate, and is to provide a manufacturing method of the copper alloy sputtering target.

Means for Solving the Problem

As the result of the further research and studies by the inventors of the present invention and others with respect to the cause of the increase of the abnormal discharge in carrying out sputtering at a higher power by using a sputtering target formed of Cu—Ca-based alloy as described in the above, they have found that the amount of oxygen contained in the sputtering target is related to the abnormal discharge.

In addition, when carrying out sputtering at a higher power by using a sputtering target formed of Cu—Ca-based alloy, they found that the content of Mg and Al contained in the Cu—Ca-based alloy in minute amounts as an inevitable impurities associated with the amount of Ca and oxygen contained therein, is related to the increase of the abnormal discharge.

As the result of the studies of the relationship between these elements and the abnormal discharge by the inventors, it was found that the impurities, such as Mg and Al contained in metal of Ca using when the Cu—Ca-based alloy is produced, react with refractory components, which constitutes a crucible to melt the Cu—Ca alloy, and a molten metal of the Cu—Ca alloy and accordingly a Ca-based complex oxide is formed. Then, it is considered that when these Ca-based complex oxides produced during melting and casting are involved in the Cu—Ca-based alloy and appears to a surface of the sputtering target, this becomes the cause of the occurrence of the abnormal discharge.

In order to achieve the above purpose, (1) a copper alloy sputtering target in an aspect of the present invention is formed by a copper alloy containing: the content of Ca being 0.3 to 1.7% by mass; the total content of Mg and Al being 5 ppm or less by mass; the content of oxygen being 20 ppm or less by mass; and the remainder is Cu and inevitable impurities.

(2) The copper alloy sputtering target in another aspect of the present invention is the copper alloy sputtering target according to (1), Fe, Mn and Si are contained as the inevitable impurities in the copper alloy sputtering target, and the content of Fe is 1 ppm or less by mass, the content of Mn is 1 ppm or less by mass, and the content of Si is 1 ppm or less by mass.

(3) A manufacturing method of a copper alloy sputtering target in another aspect of the present invention is a manufacturing method of the copper alloy sputtering target according to (1) or (2), the method comprising steps of: preparing a copper having purity of 99.99% or more by mass; melting the copper by a high frequency induction heating in a crucible in an inert gas atmosphere or a reducing gas atmosphere so as to obtain a molten copper; controlling components so as to obtain a molten metal having a predetermined component composition by the addition of Ca having a purity of 98.5% or more by mass into the molten copper and by melting the Ca; casting the molten metal having the predetermined component composition in a cooled casting mold so as to obtain an ingot; and performing stress relief annealing after performing hot rolling to the ingot.

(4) The manufacturing method of a copper alloy sputtering target in another aspect of the present invention is a manufacturing method of the copper alloy sputtering target according to (3), wherein in the step of the controlling the components, additive materials for the Ca are used by selecting Ca additives in which the content of Mg and Al is 50 ppm or less by mass respectively and the total content of Mg and Al is 100 ppm or less by mass.

(5) The manufacturing method of a copper alloy sputtering target in another aspect of the present invention is a manufacturing method of the copper alloy sputtering target according to (3) or (4), wherein the casting method in the step of casting so as to obtain the ingot is a semi-continuous casting method in which melting materials are melted using a batch furnace and casting only is continuously performed in a predetermined length or a fully-continuous casting method in which melting materials are continuously melted and casting is continuously performed in length unlimited in principle.

Effects of the Invention

According to the present invention, in forming the wiring film formed by Cu—Ca-based alloy on the substrate by sputtering using the sputtering target, the occurrence of abnormal discharge during sputtering can be suppressed. As the result, a sputtering target can be provided which prevents in advance a generation of the particles and an unevenness of a thickness of the wiring film which are caused by the abnormal discharge, and which can deposit at a high rate an even thickness of the wiring film using higher power, and a manufacturing method of the copper alloy sputtering target can be provided.

In addition, since a wiring film having an even thickness and being formed by the Cu—Ca-based alloy can be formed by the Cu—Ca-based sputtering target, a wiring film having a low specific resistance and a good adhesion properties with respect to the substrate can be formed.

EMBODIMENTS OF THE INVENTION

In the description below, one embodiment of a copper alloy sputtering target and a manufacturing method of the copper alloy sputtering target according to the present invention is explained in more detail.

The sputtering target of the present embodiment is formed by a copper alloy containing Ca (calcium) which is 0.3 to 1.7% by mass, Mg (magnesium) and Al (aluminum) in which the total content of both of them is 5 ppm or less by mass, O (oxygen) which is 20 ppm or less by mass, and the remainder which includes Cu (copper) and inevitable impurities.

Here, the reason for the limitation of component composition with respect to the copper alloy used in the present embodiment is described below.

<Ca: 0.3~1.7% by mass>

Ca is a fundamental alloy element in a Cu—Ca-based copper alloy that is handled in the present embodiment. The Cu—Ca-based copper alloy film, which is obtained by using the Cu—Ca-based copper alloy as a sputtering target used for forming a wiring of the TFT panel, shows a characteristic which the specific resistance is low as a wiring layer. In addition, the Cu—Ca-based copper alloy film is excellent in adhesion properties with respect to the substrate composed of glass, silica or the like. Furthermore, it is not necessary to use an underlayer formed by expensive materials such as Mo and Ti depending on the sputtering condition or the like, and a reduction in cost of the TFT panel can be achieved. In addition, the wiring film formed by the Cu—Ca-based copper alloy film can prevent from decreasing of the adhesion properties of the wiring film caused by a variety of heat treatment applied to a general manufacturing process of the TFT panel.

In the present embodiment, as a sputtering target when such a Cu—Ca-based copper alloy film is formed on a substrate by sputtering, a Cu—Ca-based alloy containing Ca is used. Here, when Ca is less than 0.3% by mass as a target material of Cu—Ca-based alloy, the content of Ca of the Cu—Ca-based copper alloy film formed on the substrate by sputtering becomes small, and the above described effects cannot be obtained. On the other hand, when Ca exceeds 1.7% by mass as a target material of Cu—Ca-based alloy, cracks easily occur during hot-rolling for producing plate material, and also cracks easily occur in the sputtering target obtained as a result.

The content of Ca of Cu—Ca-based alloy included in the sputtering target of the present embodiment is set in a range of 0.3 to 1.7% by mass. In addition, the content of Ca of Cu—Ca-based alloy is more preferable being set in a range of 0.5 to 1.1% by mass.

The copper alloy included in the sputtering target of the present embodiment, basically with respect to the Cu—Ca alloy containing 0.3 to 1.7% by mass of Ca as described above, is provided to suppress abnormal discharge by a decrease of oxygen content and a decrease of the total content of Mg and Al. In addition, the reason for reducing the oxygen content is to suppress a generation of Ca-based complex oxide and in order to reduce the Ca-based complex oxide appearing on the surface of the sputtering target.

Thus, it is preferable to minimize as much as possible the content of Mg, Al, Si and Fe which have a possibility to generate Ca-based complex oxide.

Among these elements, the total content of Mg and Al is required to be 5 ppm or less by mass. Furthermore, the total content of Mg and Al is preferable to be 3 ppm or less by mass.

These Mg and Al contained in Cu—Ca-based copper alloy are the elements included inevitably as impurities, but when the total content of Mg and Al is included by exceeding 5 ppm by mass, a generation rate of the Ca-based complex oxide increases, and according to this result, the occurrence of abnormal discharge increases in frequency during sputtering.

In addition, when such as Fe, Mn and Si are included as inevitable impurities besides Mg and Al, the content of these elements is preferable to be as low as possible. As an example, the content thereof is preferable to be Fe<1 ppm by mass, Mn<1 ppm by mass and Si<1 ppm by mass.

Here, generally, as a casting method of copper alloy, there are a semi-continuous casting method in which melting materials are melted using a batch furnace and casting only is continuously performed in a predetermined length and a fully-continuous casting method in which melting materials are continuously melted and casting is continuously performed in length unlimited in principle. The Cu—Ca-based alloy having the range described above can be applied to any of the above casting methods.

In the case of manufacturing the target material in mass scale, it is desired to apply a semi-continuous casting method or a fully continuous casting method.

An example of a specific method for casting the target material is explained below.

Copper material having a high purity such as electrolytic copper is melted using melting furnace. Melting is preferred to perform by installing the melting furnace in a chamber or a room which is controlled in inert gas atmosphere or reducing gas atmosphere so as to prevent from contamination of oxygen from the air into molten metal (molten copper) in melting furnace.

The casting method, which includes a steps of holding a holder such as a crucible at an inlet portion of the melting furnace installed in inert gas atmosphere or reducing gas atmosphere while the Ca metal, which has to be added, is put into the holder, after forming a molten copper, supplying the Ca metal into the molten copper in the melting furnace and obtaining a molten metal of Cu—Ca alloy, and obtaining an ingot by pouring this molten metal into a mold, can be carried out.

In addition, in a case of manufacturing by a continuous casting device, the Ca metal can be added in midstream step of transferring the molten copper to a casting mold from the melting furnace via a chute and a tundish.

In any cases, in order to obtain a target component composition, a necessary amount of alloy elements such as Ca metal is added. The molten metal of copper alloy whose component was controlled is poured into a casting mold for casting and an ingot is obtained.

In a case of melting the molten copper in melting furnace by the above casting method, it is preferable to use a copper material having high purity and containing no oxygen therein. For example, even if an oxygen-free copper having high purity of 99.99% or more is used and Mg and Al are contained in a small amount, it is preferable to use a copper material having the total content of Mg and Al being 5 ppm or less by mass and more preferably 1 ppm or less by mass for each of the elements.

When Ca as an alloy element is added, Ca metal is added, but a small amount of oxygen and impurities (Al and Mg) can be contained in the Ca metal commonly-marketed. As an example of the Ca metal, Ca metal having purity of 98.5% or more by mass, and Ca metal having the content of Mg and Al being 50 ppm or less by mass respectively and having the total content of Mg and Al being 100 ppm or less by mass can be selected and used. Of course, additive materials for Ca having higher purity as Ca metal and less total content of Mg and Al can be used.

In the present embodiment, when the necessary amount of Ca is added to the molten copper, it is important that the oxygen content be within the setting range, and furthermore, it is important that the Mg content and Al content be within the setting range. Thus, oxygen content, Mg content and Al content are set lower than target ranges in the state of the molten copper, and as a result of the addition of the additive materials for Ca at 0.3 to 1.7% by mass into the molten copper, components are controlled so that the oxygen content, Mg content and Al content are within the target ranges. For this reason, as described above, additive materials for Ca are used by selecting Ca additives in which the content of Mg and Al is 50 ppm or less by mass respectively and the total content of Mg and Al is 100 ppm or less by mass. Of course, Mg content and Al content contained in the additive materials for Ca are not limited to the ranges described above, and furthermore, additive materials for Ca having less oxygen content and additive materials for Ca having less Mg content and Al content can be applied.

In addition, in a case where the melting furnace or the like is made by a refractory mainly composed by Si, a small amount of the elements included in this refractory can be eluted from the molten copper as impurities. Also, since there is a possibility of a small amount of oxygen being inside the melting furnace even if the inside of the melting furnace is filled with inert gas or the like, despite of using an oxygen-free copper having high purity there is a possibility of a small amount of contamination of oxygen from a casting atmosphere.

From these causes, a small amount of O, Mg and Al will be contained in the ingot obtained after casting. Also, Si, Fe and the like, may be contained in addition to the above elements.

In the present embodiment, the content of O, which is one of these elements and may be contained in a small amount, must be 20 ppm or less by mass. In addition, the total content of Mg and Al must be restricted to 5 ppm or less by mass. Also, it is more preferable to restrict the content of O to 10 ppm or less by mass and the total content of Mg and Al to 3 ppm or less by mass.

As described above, if the sputtering target, which is formed by Cu—Ca alloy having the content of O being 20 ppm or less by mass and having the total content of Mg and Al being 5 ppm or less by mass, is placed on a backing plate made of oxygen-free copper and is joined to the backing plate by a method such as soldering, the sputtering target having a backing plate can be obtained.

This sputtering target along with TFT panel or the like is housed in a chamber for deposition of a sputtering apparatus using direct current system or the like, the chamber is reduced the pressure to ultimate pressure of $4 \times 10^{-5}$ Pa or the like, a predetermined power is applied over a predetermined time, and sputtering is carried out.

By using the sputtering target formed by Cu—Ca alloy restricting the content of Mg and Al being 5 ppm or less by mass with in addition of restricting the O content, abnormal discharge does not occur when sputtering is carried out at the output such as 600 W, and abnormal discharge does not occur even when sputtering is carried out at a high output such as 1800 W.

Since abnormal discharge does not occur when sputtering is carried out at the high output such as 1800 W, when a deposition is performed by using the sputtering target related to the present embodiment, the deposition speed of the target Cu—Ca-based wiring film can be improved and it contributes to the efficiency of the wiring film formation on such as a TFT panel.

EXAMPLES

"Manufacturing of Sputtering Target"

An oxygen-free copper having purity of 99.99% or more by mass (in which a screening was carried out so as to obtain the oxygen-free copper containing the content of Al, Si, Mg and Fe being 1 ppm or less by mass respectively) was prepared. This oxygen-free copper was melted by a high frequency induction heating in a high-purity graphite crucible in an Ar gas atmosphere. Ca having purity of 98.5% or more by mass (in which a screening was carried out so as to obtain Ca material containing the content of Mg and Al being 50 ppm or less by mass respectively and the total content of Mg and Al being 100 ppm or less by mass) was added to the obtained molten metal and was melted. The component was controlled so as to obtain a molten metal having predetermined component compositions. The obtained molten metal was casting using a casting iron casting-mold which had been cooled, and an ingot was obtained.

Furthermore, hot rolling at 800° C. was performed on the ingot, and then, ultimately, stress relieve annealing was performed at 400° C., machining by turning the surface of the obtained rolled plate was performed, and a sputtering target having a circular disc shape, having 152 mm of outer diameter and 5 mm of thickness, and containing a predetermined component compositions as described above was manufactured.

In manufacturing the sputtering target, samples of sputtering target varied in their Ca additive amount in a range of 0.3 to 1.7% by mass were obtained and they were described as No. 1 to 11 in Table 1 shown hereafter.

For controlling the oxygen concentration in each of the samples of the sputtering target described as No. 1 to 11, the contamination of oxygen from the atmosphere under melting conditions was simulated. A tough pitch copper having purity of 99.99% or more by mass (oxygen concentration is approximately 100 ppm by mass, and the content of Al, Si, Mg and Fe is 1 ppm or less by mass respectively) was prepared, this tough pitch copper and an oxygen-free copper were melted together by a high frequency induction heating in a high-purity graphite crucible in an Ar gas atmosphere, the obtained molten metal was processed in the same method described before, and a sputtering target was manufactured.

Furthermore, as comparing samples varied in the content of Mg and Al, Ca (in which a screening was carried out so as to obtain the Ca having the content of Mg and Al being 2000 and 3000 ppm by mass respectively) having 95% or more by mass was used as a Ca additive materials, the other manufacturing steps were set equivalent to the samples described above, and sputtering targets were obtained as comparing samples. In these sputtering targets, the increase and decrease of Ca content was performed depend on the additive amount of additive materials for Ca, the comparing samples having oxygen in a large content and the comparing samples having Mg and Al in a large content were obtained, and these samples were performed sputtering as described hereafter.

The analytical samples were collected from the target after stress relief annealing, and oxygen was analyzed by gas analysis and Ca and other impurities were analyzed by ICP emission spectroscopy.

In addition, the sputtering target obtained as described above was placed on the oxygen-free copper backing plate and was soldered thereto with an indium solder. Accordingly, a target with a backing plate was obtained.

"Sputtering and Counting Method of Abnormal Discharge"

Sputtering was performed using the sputtering target. Direct current system was adopted as a power supply of the sputtering apparatus, and the vacuum chamber of the sputtering apparatus was evacuated up to an ultimate vacuum pressure of $4 \times 10^{-5}$ Pa or less. Then, Oxygen-Ar mixed gas including pure Ar gas or oxygen in a proportion of 10% by volume was supplied into the vacuum chamber as a sputtering gas, after a pressure of the sputtering atmosphere being set to 0.67 Pa, discharging was performed for 8 hours at the output of 600 W or 1800 W, and the total number of abnormal discharge was counted by measuring the number of occurrence of abnormal discharge during the discharge thereof by using an arc counter provided to the power supply.

"Evaluation of Adhesion Properties After Plasma Treatment"

According to the conventional film forming condition, a glass substrate 1737 produced by Corning Company having sizes of 20 mm in length×20 mm in width x and 0.7 mm in thickness was prepared. This glass substrate was set into the sputtering apparatus. As a target, the sputtering targets which were made by Cu—Ca alloy having composition shown in Table 1 and all of which were prepared by being melted were used. After depositing 50 nm at the sputtering atmosphere of Oxygen-Ar mixed gas including oxygen in a proportion of 10% by volume, the sputtering atmosphere was changed to pure Ar gas and 250 nm sputtering was performed, and a conductive film having a thickness of 300 nm in total was formed.

Subsequently, a hydrogen plasma treatment was performed under the same condition of the hydrogen plasma treatment performed conventionally, that is, gas: 100% of hydrogen gas, hydrogen flow rate: 500 sccm, pressure of hydrogen gas: 100 Pa, treating temperature: 300° C., RF power density: 0.1 W/cm², treatment time: 2 minutes, and the samples of the conductive film of the examples of the present invention No. 1 to 11 and comparative example No. 12 to 18 were manufactured. In order to confirm the adhesion properties of the examples of the present invention No. 1 to 11 and the comparative examples No. 12 to 18, a cross-cut adhesion test was performed under the following conditions.

The cross-cut adhesion test is a test in accordance with JIS-K5400, and the test includes the steps of: making 11 cut lines at 1 mm intervals arranged in a matrix on the surface of each of the above samples at a depth reaching the glass substrate from the surface by using a cutter; forming 100 squares; attaching a scotch tape manufactured by 3M Company on over the whole squares so as to be in close contact; then peeling off at once; and counting the number of the squares (piece/100), which were peeled off, from the 100 squares of the sample surface.

Table 1 below shows: samples No. 1 to 11 as the examples of the present invention applied to sputtering; the content of Ca (% by mass) in the samples No. 12 to 18 as the comparative examples; the content of oxygen (ppm by mass); the content of Mg (ppm by mass); the content of Al (ppm by mass); presence of cracks caused by hot-rolling; the number of abnormal discharge; and adhesion properties of the adhesion test using tape after hydrogen plasma treatment (%).

TABLE 1

| | Sample No. | Ca % by mass | O | Mg | Al | Total | Remainder | Cracks in Hot-rolling | The number of abnormal discharge (times/8 hours) 600 W Pure Ar | 600 W Ar-O₂ | 1800 W Pure Ar | 1800 W Ar-O₂ | Adhesion Properties of test tape after Hydrogen Plasma Treatment (%) |
|---|---|---|---|---|---|---|---|---|---|---|---|---|---|
| | | | ppm by mass | | | | | | | | | | |
| Examples of Present Invention | 1 | 0.3 | 9 | 1 | 1 | 2 | Cu | None | 0 | 0 | 0 | 0 | 100 |
| | 2 | 0.4 | 10 | 2 | 0.5 | 2.5 | Cu | None | 0 | 0 | 0 | 0 | 100 |
| | 3 | 0.5 | 7 | 1 | 2 | 3 | Cu | None | 0 | 0 | 0 | 0 | 100 |
| | 4 | 0.5 | 8 | 0.5 | 0.5 | 1 | Cu | None | 0 | 0 | 0 | 0 | 100 |
| | 5 | 0.7 | 9 | 0.5 | 0.5 | 1 | Cu | None | 0 | 0 | 0 | 0 | 100 |
| | 6 | 0.7 | 13 | 2 | 2 | 4 | Cu | None | 0 | 0 | 0 | 0 | 100 |
| | 7 | 1.1 | 16 | 1 | 1 | 2 | Cu | None | 0 | 0 | 0 | 0 | 100 |
| | 8 | 1.1 | 8 | 0.2 | 0.3 | 0.5 | Cu | None | 0 | 0 | 0 | 0 | 100 |
| | 9 | 1.4 | 10 | 2 | 1 | 3 | Cu | None | 0 | 0 | 0 | 0 | 100 |
| | 10 | 1.7 | 18 | 1 | 3 | 4 | Cu | None | 0 | 0 | 0 | 0 | 100 |
| | 11 | 0.7 | 4 | 1 | 1 | 2 | Cu | None | 0 | 0 | 0 | 0 | 100 |
| Comparative Examples | 12 | 2.0 | 10 | 5 | 10 | 15 | Cu | Present | — | — | — | — | — |
| | 13 | 0.7 | 25 | 1 | 1 | 2 | Cu | None | 0 | 0 | 35 | 25 | 100 |
| | 14 | 0.4 | 10 | 3 | 4 | 7 | Cu | None | 0 | 0 | 22 | 35 | 100 |
| | 15 | 0.7 | 15 | 4 | 4 | 8 | Cu | None | 0 | 0 | 26 | 32 | 100 |
| | 16 | 1.0 | 11 | 5 | 6 | 11 | Cu | None | 0 | 0 | 40 | 25 | 100 |
| | 17 | 1.5 | 10 | 7 | 10 | 17 | Cu | None | 0 | 0 | 33 | 35 | 100 |
| | 18 | 0.1 | 9 | 1 | 2 | 3 | Cu | None | 0 | 0 | 0 | 0 | 0 |

The samples No. 1 to 11 in Table 1 shows the sputtering target formed by Cu—Ca alloy setting in a range of: the content of Ca being 0.3 to 1.7% by mass; the content of O (oxygen) being 20 ppm or less by mass (8 to 18 ppm by mass); the content of Mg being 0.2 to 2 ppm by mass; and the content of Al being 0.3 to 3 ppm by mass.

In the sputtering target of sample No. 1 to 11, cracks caused by rolling during hot-rolling did not occur, abnormal discharge did not occur when sputtering for 8 hours at the output of 600 W, and abnormal discharge did not occur when sputtering for 8 hours at the output of 1800 W.

According to this test result, the sputtering target formed by copper alloy containing the content of Ca being 0.3 to 1.7% by mass, the content of oxygen being 20 ppm or less by mass, the total content of Mg and Al being 5 ppm or less by mass, even when the supply power is increased during sputtering and a high-rate sputtering is performed, a conductive film can be deposited without leading abnormal discharge. Therefore, when a conductive film is formed using the sputtering target described above, a good quality conductive film having no irregularity on its surface and having an even thickness can be manufactured quickly.

In Table 1, the sample No. 12 (Comparative Example) was a sample increased in Ca content such that the content of Ca is 2.0% by mass, and this sample occurred cracks during hot-rolling. The sample No. 13 (Comparative Example) was a sample increased in oxygen content such that the content of oxygen is 25 ppm by mass, and abnormal discharge did not occurred at the output of 600 W in this sample, but a lot of abnormal discharge occurred when sputtering is performed at the output of 1800 W in this sample.

The samples No. 14, 15, 16, 17 (Comparative Examples) were samples increased in the total content of Mg and Al, and abnormal discharge did not occurred at the output of 600 W in these samples, but a lot of abnormal discharge occurred when sputtering was performed at the output of 1800 W in these samples.

The sample No. 18 (Comparative Example) is a sample decreased in Ca content such that the content of Ca is 0.1% by mass, and the adhesion properties by the adhesion test using tape after hydrogen plasma treatment reduced significantly.

What is claimed is:

1. A copper alloy sputtering target formed by a copper alloy comprising:
   the content of Ca being 0.3 to 1.7% by mass;
   the total content of Mg and Al being 5 ppm or less by mass;
   the content of oxygen being 20 ppm or less by mass; and
   the remainder being Cu and inevitable impurities,
   wherein Fe, Mn and Si are contained as the inevitable impurities in the copper alloy sputtering target, and
   the content of Fe is 1 ppm or less by mass, the content of Mn is 1 ppm or less by mass, and the content of Si is 1 ppm or less by mass so that the contents of Mg, Al, Fe, Mn, and Si are minimized to suppress a generation of Ca-based complex oxide and to reduce the Ca-based complex oxide appearing on the surface of the sputtering target.

* * * * *